United States Patent
Chen

Patent Number: 5,815,431
Date of Patent: Sep. 29, 1998

[54] NON-VOLATILE DIGITAL CIRCUITS USING FERROELECTRIC CAPACITORS

[75] Inventor: Deng-Yuan David Chen, Fremont, Calif.

[73] Assignee: VLSI Technology, Inc., San Jose, Calif.

[21] Appl. No.: 802,604

[22] Filed: Feb. 19, 1997

[51] Int. Cl.[6] ................................................ G11C 11/22
[52] U.S. Cl. .......................... 365/145; 365/149; 365/156
[58] Field of Search ................................... 365/145, 149, 365/156, 205

[56] References Cited

U.S. PATENT DOCUMENTS

| | | | |
|---|---|---|---|
| 4,873,664 | 10/1989 | Eaton, Jr. ................................. | 356/145 |
| 5,128,566 | 7/1992 | Papaliolios ............................... | 365/145 |
| 5,495,437 | 2/1996 | Tai et al. .................................. | 365/145 |
| 5,572,459 | 11/1996 | Wilson et al. ........................... | 365/145 |
| 5,668,753 | 9/1997 | Koike ....................................... | 365/145 |
| 5,680,344 | 10/1997 | Seyyedy ................................... | 365/145 |

OTHER PUBLICATIONS

Chen, D.; "Principle of Ferroelectric Memory Design"; *invited paper; Industrial Material*; Taiwan; Nov. 1995.
"High–density FRAM: ready for prime time"; Advertisement by Hitachi America; Oct. 10, 1996.
"FRAM Memory Products" Product Specifications; Ramtron International Corporation; Colorado Springs, Co; 1994.

*Primary Examiner*—David C. Nelms
*Assistant Examiner*—Hoai V. Ho
*Attorney, Agent, or Firm*—Majestic, Parsons, Siebert & Hsue

[57] ABSTRACT

A circuit including a ferroelectric capacitor can be used to store the value of nodes of volatile logic elements in a logic circuit. In this manner, the state of a complex logic circuit, such as a CPU or an I/O device, can be stored in the non-volatile ferroelectric capacitors. After an accidental or planned power outage, the non-volatile ferroelectric capacitors can be used to restore the values of the nodes. Additionally, a planned power loss can be save system power in circuits that are power consumption sensitive.

31 Claims, 7 Drawing Sheets

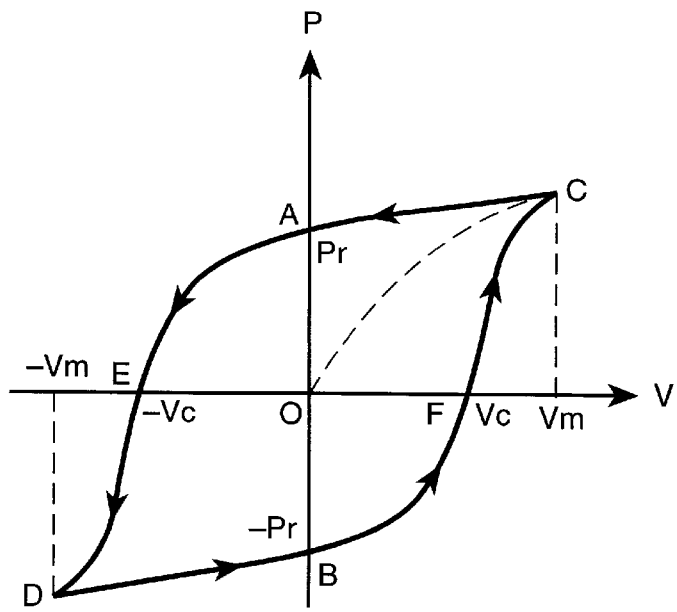
FIG._1A
(PRIOR ART)
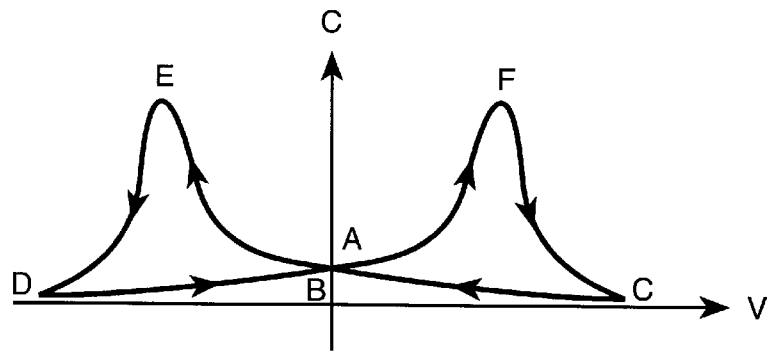
FIG._1B
(PRIOR ART)
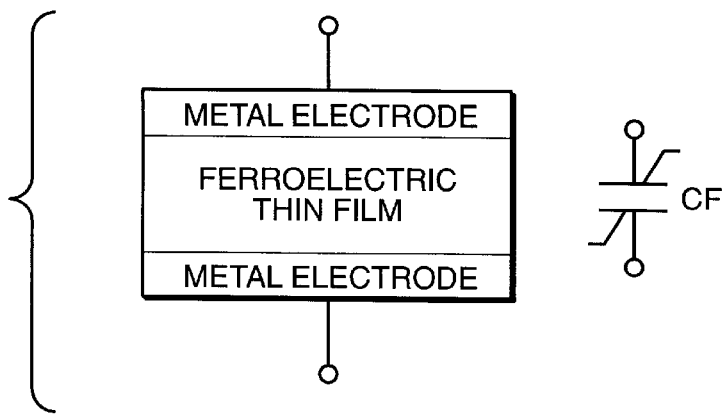
FIG._1C
(PRIOR ART)

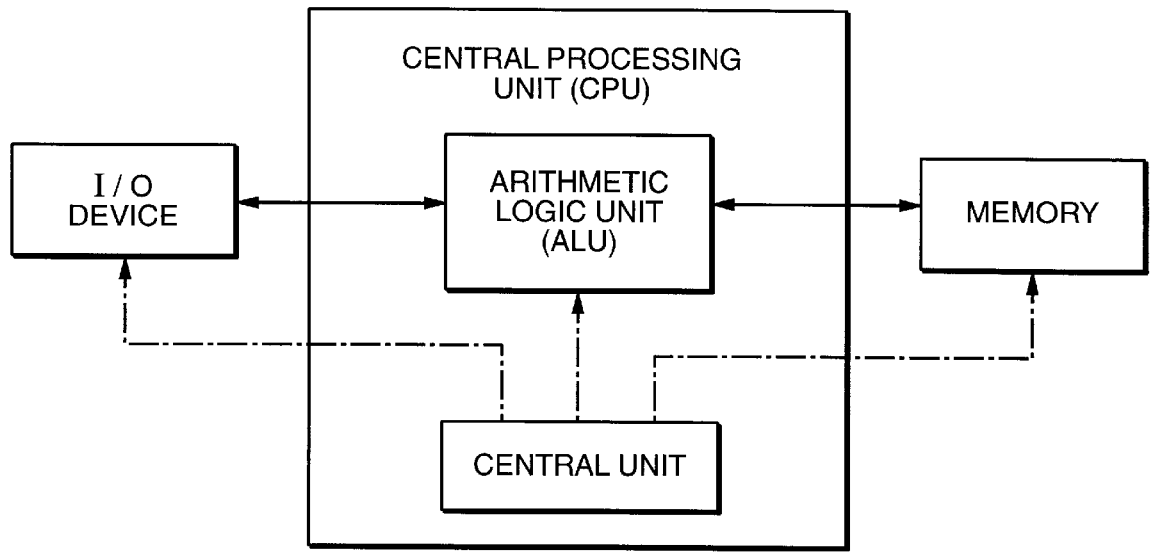
FIG._2
(PRIOR ART)
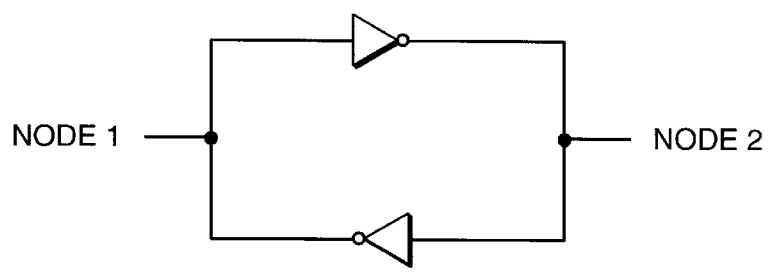
FIG._7
(PRIOR ART)

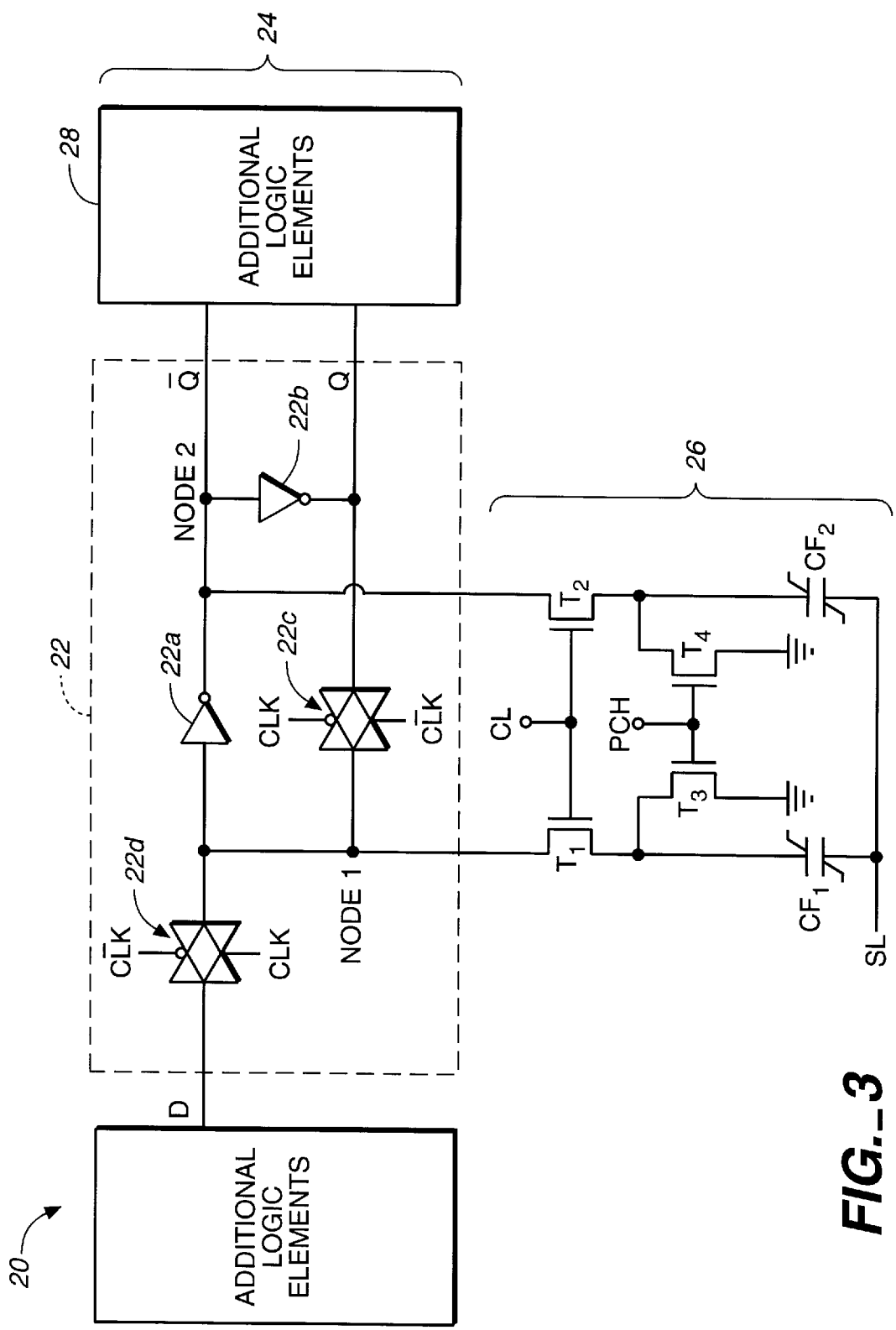
FIG._3

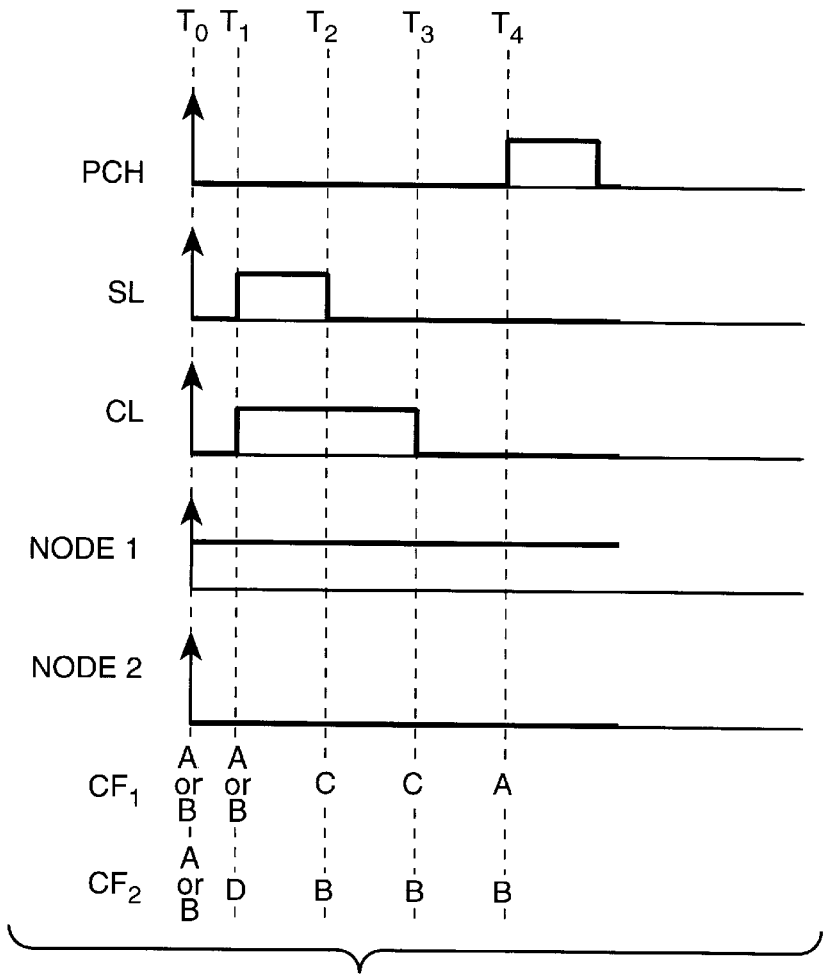
FIG._4A
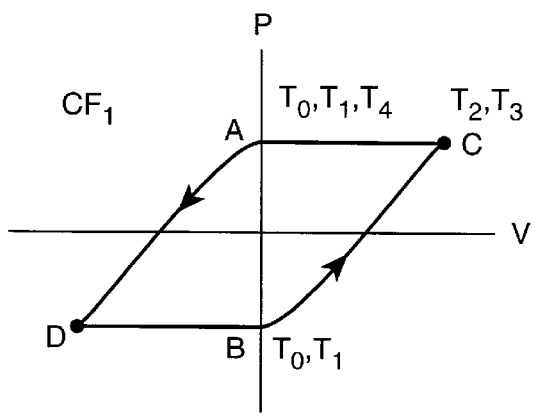
FIG._4B
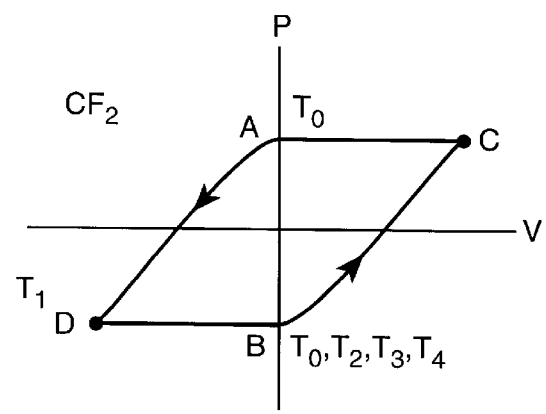
FIG._4C

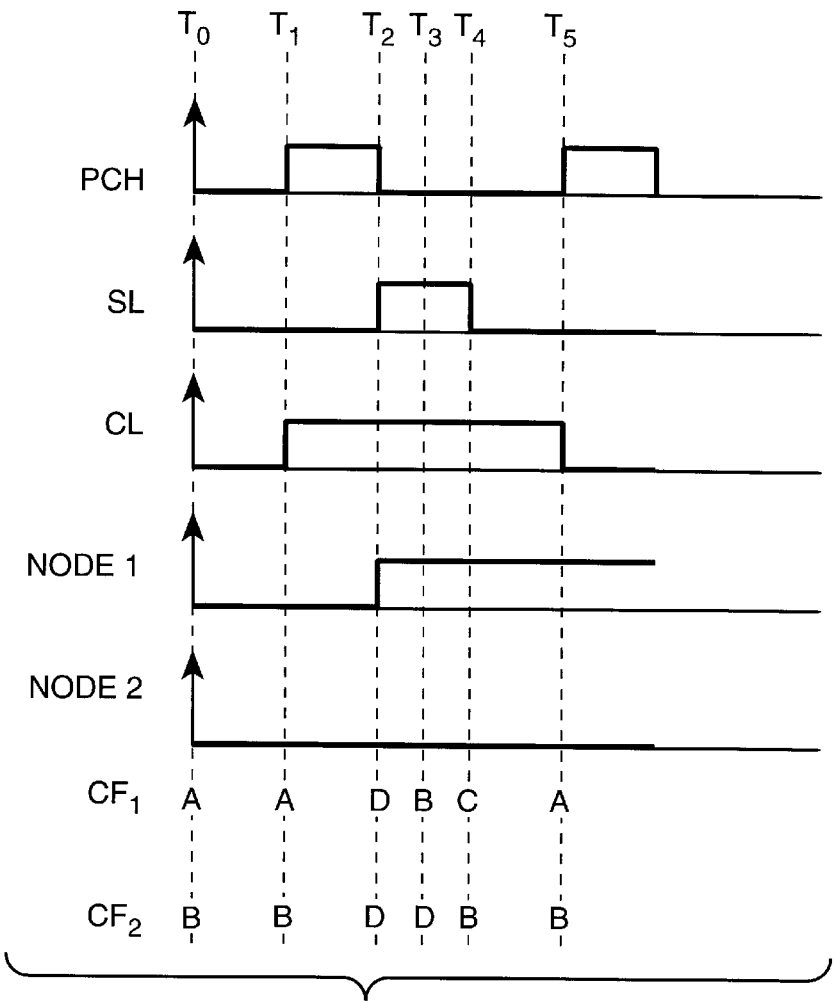
FIG._5A
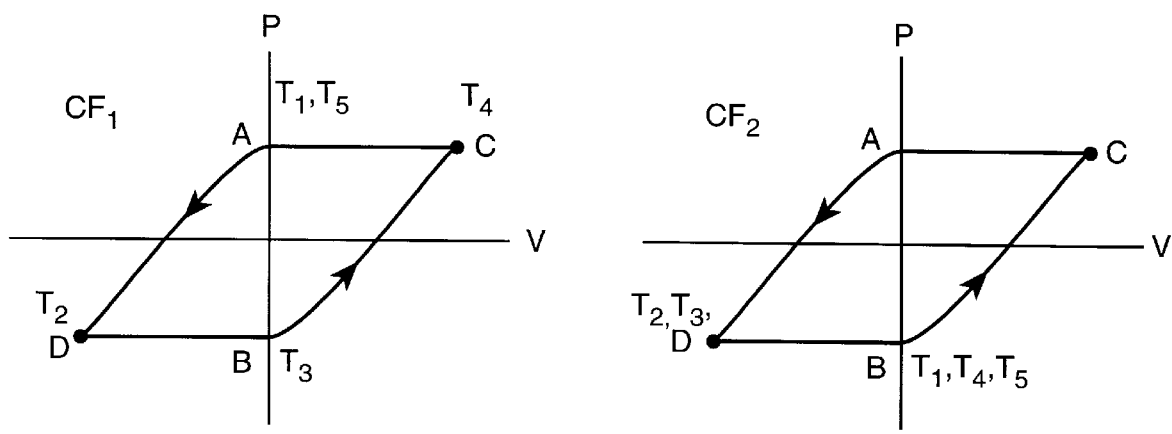
FIG._5B  FIG._5C

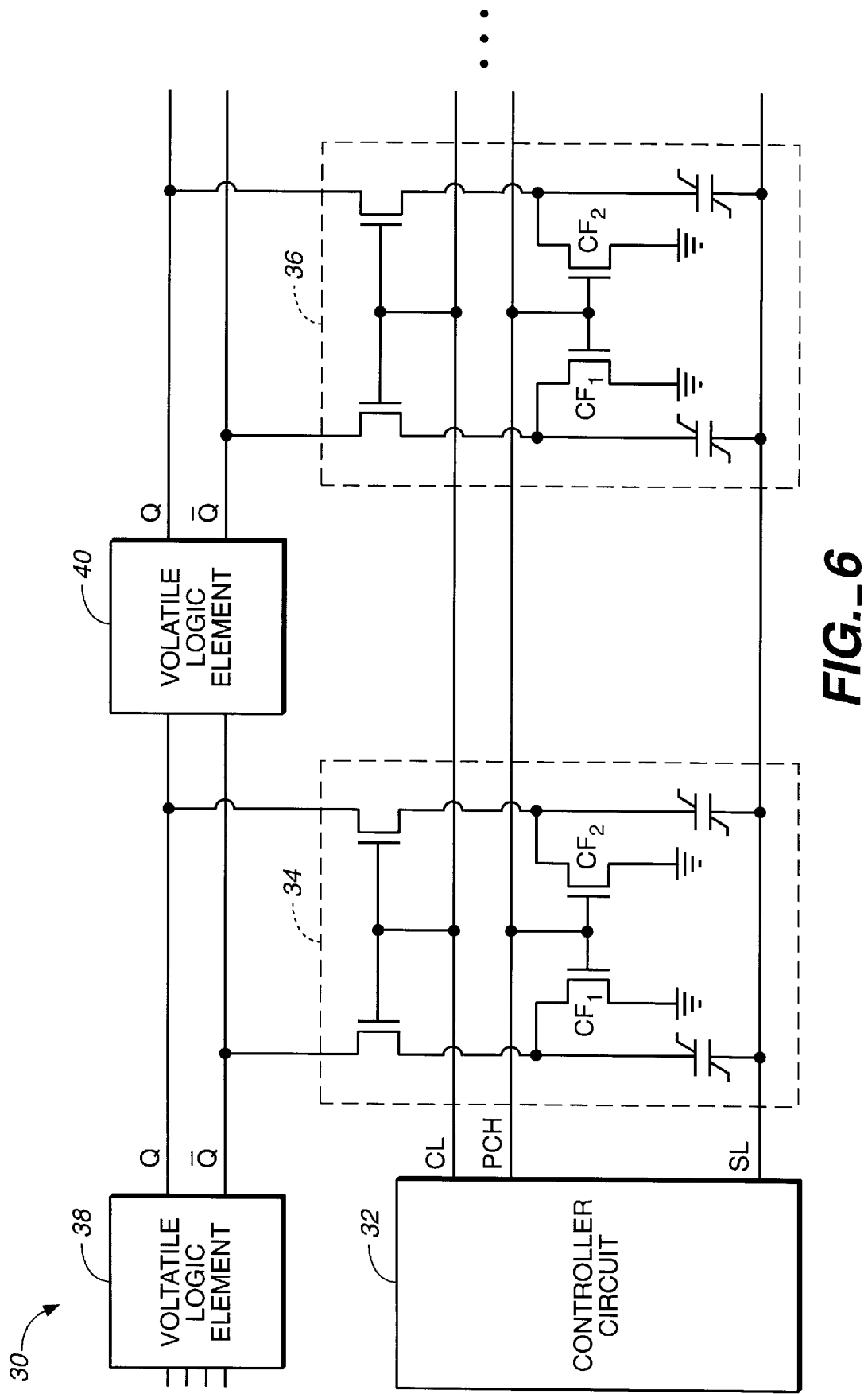
FIG._6

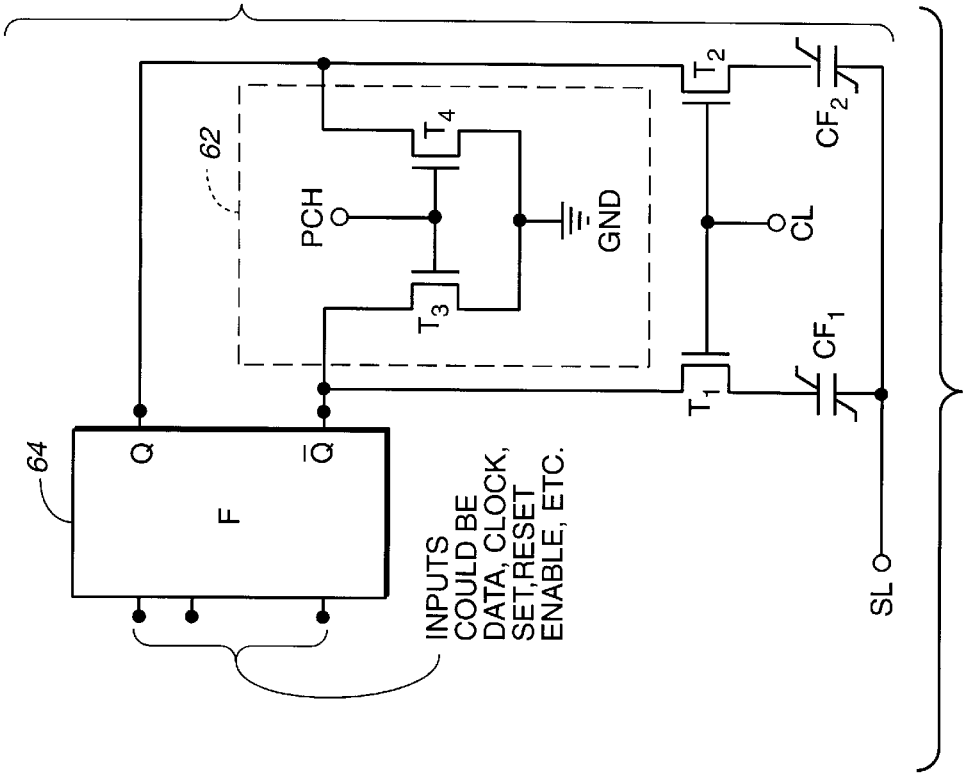
FIG._9
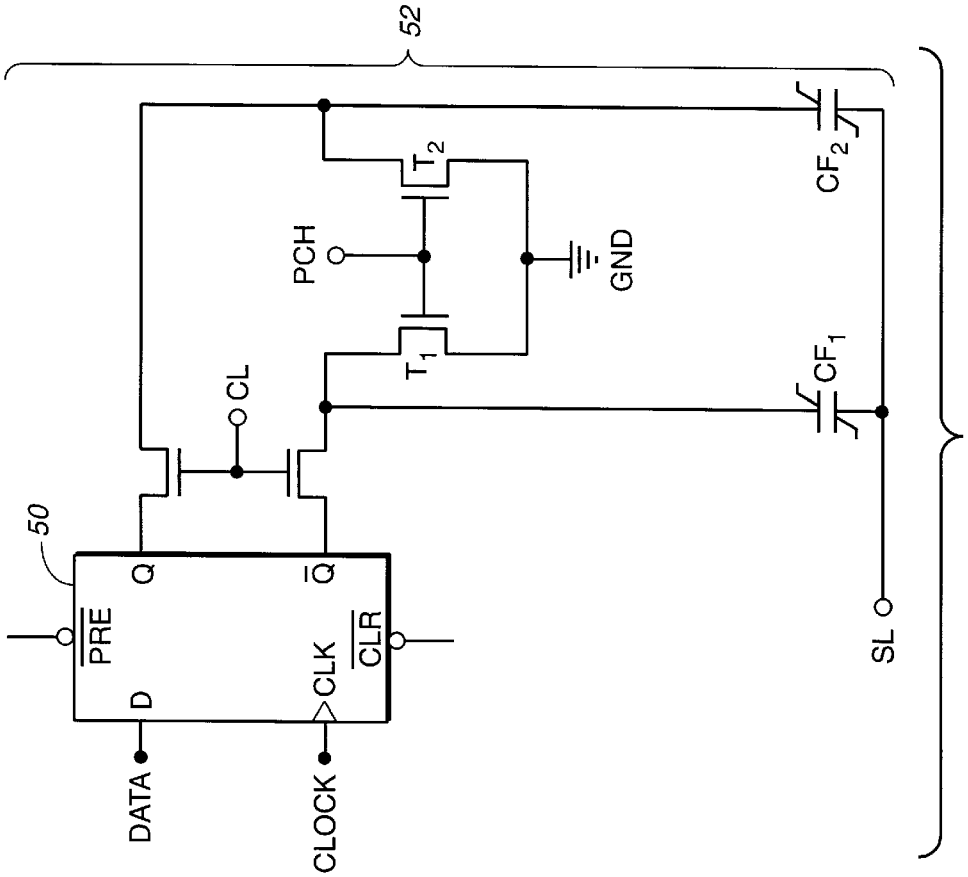
FIG._8

NON-VOLATILE DIGITAL CIRCUITS USING FERROELECTRIC CAPACITORS

BACKGROUND OF THE INVENTION

The present invention relates to systems for the non-volatile storing of information, especially the use of non-volatile systems outside of a memory chip for a computer system.

Prior art non-volatile information storage has been done with electrically erasable programmable random access memory (EEPROM) or flash memory. These systems have the disadvantage that the write time is much larger than the write time for dynamic random access memory (DRAM). The typical write time for an EEPROM is about five microseconds compared to fifty nanoseconds for the DRAM. Thus, EEPROMs take about a hundred thousand times longer to write to than DRAMs. Another limitation for conventional semiconductor non-volatile memory elements is that the maximum guaranteed number of read-write endurance cycles is only about one hundred thousand cycles for EEPROMS and flash memory.

Some of these disadvantages have been overcome with the use of thin-film ferroelectric capacitors. Various electric materials are known, such as phase III potassium nitrate, bismuth titanate, and the lead zirconate/titanate (PZT) compound family.

The ferroelectric thin-film capacitors are used in memory chips as a replacement for EEPROMs or flash memory. Eton Jr. U.S. Pat. No. 4,873,664, and Chen, "Principles of Ferroelectric Memory Design," invited paper, *Industrial Material*, Taiwan, November 1995, which are both incorporated herein by reference, describe the use of ferroelectric capacitors in memory chips.

FIG. 1 shows a hysteresis curve typical for PZT material. The hysteresis curve shows the polarization versus the applied voltage on a thin-film ferroelectric capacitor. When the material is first produced, it starts at the origin O. If an applied voltage $V_M$ is applied, the state moves from the origin O to point C on the polarization curve.

Note that when the ferroelectric capacitor is on the polarization curve, it can have two different polarization states for the same applied voltage. At zero applied voltage, the polarization of the ferroelectric capacitor could be at state A, polarization $P_r$, or state D, polarization $-P_r$, depending on the capacitor's past history. In this way, the ferroelectric capacitor can be used to store data. For example, the polarization state A could represent a logical "1" and the polarization state D could represent a logical "0" or vice versa.

Considering the ferroelectric capacitor at a point C which indicates an applied voltage $V_M$, if the applied voltage is reduced to zero, the polarization will follow the hysteresis curve along the path indicated by the arrows towards point A. If a negative voltage $-V_M$ is then applied, the ferroelectric capacitor will move along the hysteresis curve from point A to point D. If at this point the voltage is removed, the polarization state of the ferroelectric capacitor will move along the other leg of the hysteresis curve to point B, rather than going back towards point A. If applied voltage $V_M$ is then applied to the ferroelectric capacitor, the polarization state will move from point B to point C.

FIG. 1B illustrates a capacitance/voltage curve showing the capacitance of the ferroelectric capacitor versus the applied voltage.

FIG. 1C are diagrams illustrating the symbol for the ferroelectric thin-film capacitor. Typically, a ferroelectric capacitor has metallic conductive plates separated by about 500 Angstroms to 100 micrometers of a ferroelectric material, such as a PZT, as a dielectric between the plates.

SUMMARY OF THE INVENTION

The present invention concerns the use of ferroelectric capacitors in a non-volatile circuitry to store the value of volatile logic elements in a logic circuit. In this way, the volatile logic circuit can be protected from a power loss by storing the value of nodes of logic elements onto the ferroelectric capacitors. The ferroelectric capacitor can be used to restore the value of the nodes of the volatile logic element.

In complementary metal oxide silicon (CMOS) processes, many volatile logic elements include nodes having complementary logic values. These complementary nodes values are often maintained by a matched pair of inverters. The inventor has realized that a pair of ferroelectric capacitors storing complementary polarization values can be used to restore the nodes of the volatile logic element to a desired state. If $-V_M$ is supplied across two ferroelectric capacitors, a first ferroelectric capacitor moving from polarization state A to polarization state D will supply more charge than another ferroelectric capacitor moving from polarization state B to polarization state D. In a case described below in more detail, this can cause the node of the volatile logic element operably connected to the first logic element to tip toward a logic "one." As the logic nodes of the volatile logic element are tipped to the restored values, self-restoring of the ferroelectric capacitor values will occur.

Prior art memory cell arrays of ferroelectric capacitors are not operably connected to volatile logic elements to store the state of these elements. The non-volatile circuitry of the present invention using ferroelectric capacitors will be typically located near the volatile logic element to quickly store/restore the volatile logic element's state.

The present invention is advantageous when used with central processing units (CPU) or input-output (I/O) circuits. As shown in FIG. 2, the ferroelectric capacitors in the past have been typically used in the secondary memory circuit in an separate memory array chip.

By putting a ferroelectric capacitor non-volatile circuit adjacent the volatile logic elements, many advantages occur. The ferroelectric capacitor can store the current logic state without degrading the logic circuit's timing performance. With the power shut off accidentally (such as in a power failure), or intentionally (such as in power saving for portable systems), the non-volatile ferroelectric capacitor circuits can store the current logic state information of a hardware system, such as the central processing unit (CPU) or input/output (I/O). The logic states can be restored when the power comes back. Moreover, the circuitry including the ferroelectric capacitor can restore the exact information as before without even re-booting the system, i.e., without loading data from a non-volatile memory array and without loading instructions from a basic input-output system (BIOS). The circuitry with the ferroelectric capacitors can be used to protect all the data from the power failure. It can save all the logic states for each logic element during each instruction cycle.

If the power is accidentally turned off and later restored, the non-volatile circuitry of the present invention can restore all of the logic states in the volatile logic circuit. For example, assume that someone was editing a file on a computer without having saved the file for ten minutes, and the power suddenly goes off, and later, the power comes back on. A computer with the non-volatile functionality should put the computer in the exact same state as before the power was off. This feature is also important for testing equipment.

For example, if a power failure occurs on typical testing equipment needing overnight computer terminal testing to finish, ordinarily the testing system would completely stop due to the power failure. With the non-volatile data storage system, the power failure problem would act as a type of software pause and the testing procedure would be back on and automatically running when the power returns, without losing data.

Another type of advantage is as an energy saving system. Whenever the computer has not been touched for a certain period of time, i.e., ten minutes, the computer could completely shut off, except for a low-power consumption keyboard or mouse. When any key or the mouse is touched, the system would activate in the same state before the power was removed. This feature is very useful for portable systems in which power consumption is a key problem. Additionally, the computer using circuitry to store data from volatile logic elements could make the step of boot-up loading optional. Whenever we boot-up a conventional computer, the computer loads instruction codes from the low-access speed BIOS ROM to the much faster main memory, such as a DRAM or SRAM. The reading and transferring of the BIOS to main memory is one of the major tasks of boot-up for most computer systems. Usually, it takes up to a couple of minutes for the loading, depending upon the complexity of the BIOS. With the non-volatile computer system of the present invention, this step becomes optional. Instead, the chip manufacturer could code the BIOS directly into the main memory, which should use fast read-write non-volatile memory such as a non-volatile ferroelectric capacitor based memory. In this way, the boot-up will take less time. An optional conventional BIOS ROM in the system could be used in case the BIOS is damaged or lost in the main memory.

The non-volatile circuitry preferably includes a ferroelectric capacitor, pre-charge circuitry, and an isolation transistor. In a preferred embodiment, the value of two complementary nodes of each volatile logic element are stored/restored and thus two isolation transistors and two ferroelectric capacitors are used. In a preferred embodiment, the pre-charge circuitry can be isolated from the volatile logic element using the isolation transistors.

The controller unit can be used to send the same control signals to each of non-volatile memory elements. This is an advantage in that an addressing scheme is not required. Additionally, the storing of the node values and the re-storing of the node values for the entire circuit can be done at the same time, preferably within each clock cycle. Such a quick storing of data is not possible in the prior art memory array systems. Memory cells in the prior art memory array systems have shared bit lines, shared pre-charged circuits, and shared sense-amps. Only one array memory cell in each column can be written to at a time.

BRIEF DESCRIPTION OF THE DRAWINGS

FIG. 1A is a graph of the polarization versus voltage hysteresis curve for a ferroelectric thin-film capacitor.

FIG. 1B is a graph of the capacitance versus voltage curve for a ferroelectric thin-film capacitor.

FIG. 1C are diagrams of ferroelectric thin-film capacitors.

FIG. 2 is a diagram of a prior art computer system.

FIG. 3 is a diagram illustrating the apparatus of the present invention, including a volatile logic element and a non-volatile circuitry with a ferroelectric capacitor to store the logic node values.

FIG. 4A is a timing diagram illustrating the storing of the logic element node value using the ferroelectric capacitor for the apparatus of FIG. 3.

FIG. 4B is a graph illustrating the hysteresis curve of the ferroelectric capacitor showing the state of ferroelectric capacitor $CF_1$ at different times during the store operation of FIG. 4A.

FIG. 4C is a graph of the hysteresis curve of a ferroelectric capacitor showing the state of the ferroelectric capacitor $CF_2$ at different times during the store operation of FIG. 4A.

FIG. 5A is a timing diagram illustrating the restoring of the values of the logic element node values using the ferroelectric capacitor for the apparatus of FIG. 3.

FIG. 5B is a graph of a hysteresis curve showing the state of the ferroelectric capacitor $CF_1$ at different times during the restore operation of FIG. 5A.

FIG. 5C is a graph of a hysteresis curve of a ferroelectric capacitor $CF_2$ at different times during the restore operation of FIG. 5A.

FIG. 6 is a diagram of an alternate embodiment of the apparatus of the present invention showing a controller supplying control signals to the non-volatile circuits using ferroelectric capacitors.

FIG. 7 is a diagram illustrating matched inverters inside a volatile logic element.

FIG. 8 is a diagram illustrating a non-volatile ferroelectric capacitor storage circuit connected to a flip-flop.

FIG. 9 is a diagram illustrating an alternate embodiment of the apparatus showing an alternate circuitry using a ferroelectric capacitor to store/restore node values of a volatile logic element.

DETAILED DESCRIPTION OF THE DRAWINGS

FIG. 3 is a diagram illustrating the apparatus 20 of the present invention using a volatile logic circuit 22 as part of a logic circuit 24. Circuitry 26 including the ferroelectric capacitors $CF_1$ and $CF_2$ are used to store and re-store values at nodes in the volatile logic element 22.

Ferroelectric thin-film fabrication is compatible with the current CMOS processes. The ferroelectric capacitor forming steps act as backend interconnect process of the CMOS. In a typical CMOS process, after the metal 1 is etched, the first interconnect dielectric layer is deposited. At this point, the lower electrode metal and ferroelectric thin film may be deposited, followed by a drying and/or baking. Then a top electrode metal can be deposited, followed by an annealing and etching to define the ferroelectric capacitor. After this, the additional CMOS process steps can resume.

In a preferred embodiment, isolation transistors T1–T2 are connected to the ferroelectric capacitors CF1 and CF2. A pre-charged circuit using capacitors T3 and T4 are also preferably used. The isolation transistors T1 and T2 and pre-charge transistors T3 and T4 are preferably matched. As shown in FIG. 3, in the preferred embodiment, the ferroelectric capacitors $CF_1$ and $CF_2$ are attached to a set line (SL). The pre-charge circuitry is connected to the other end of the ferroelectric capacitors $CF_1$ and $CF_2$. A high signal at the pre-charge line (PCH) pulls down these two positions to ground. Isolation transistors T1 and T2 are controlled by a control line (CL). These transistors can connect and disconnect the nodes of the logic element 22 from the ferroelectric capacitors $CF_1$ and $CF_2$. The operation of the circuitry 26 and the volatile logic element 22 can be best seen with respect to FIGS. 4A–C and 5A–C.

FIG. 4A is a timing diagram illustrating the storing of the logic element node value using the ferroelectric capacitor for the apparatus of FIG. 3. At time $T_0$, node 1 is arbitrarily shown as "high" and node 2 is shown as "low." The nodes 1 and node 2 are chosen by the designer such that the nodes have complementary values during the normal operation of the volatile logic element 22. Such complementary nodes are commonly used in CMOS logic circuits. Note that in logic circuit 22, node 1 and node 2 are connected by inverters 22a and 22b. It is also common that such inverters 22a and 22b are made of matched-pair transistors. The store operations described below with respect to FIG. 4 would occur in between the clock pulses of the logic circuit 24.

At time $T_1$, the set line (SL) is high and the control line (CL) to the isolation transistors is also high. Since the voltage at node 1 is high and the voltage on the set line is high, the voltage differential across the ferroelectric capacitor $CF_1$ will be zero volts. This means that the ferroelectric capacitor $CF_1$ will remain in the original polarization state, either state A or B. The ferroelectric capacitor $CF_2$ will start in the polarization state B or A, but since node 2 is low and SL high, there will be a negative voltage differential across the capacitor $CF_2$. The negative voltage differential will force the state of the $CF_2$ to polarization state D.

At time $T_2$, the set line is drops to low. Since node 1 is high, there is a positive voltage differential across ferroelectric capacitor $CF_1$. This will move ferroelectric capacitor $CF_1$ from either polarization state A or B to polarization state C. Additionally, there is no voltage differential across the ferroelectric capacitor $CF_2$, so ferroelectric capacitor $CF_2$ will move from polarization state D to polarization state B.

At time $T_3$, line CL goes low isolating nodes 1 and 2 from the ferroelectric capacitors $CF_1$ and $CF_2$. At this time, the clock signal to the logic circuit can switch the node values without interfering with the stored state of the ferroelectric capacitors $CF_1$ and $CF_2$.

At time $T_4$, the pre-charge system sets the top of both capacitor $CF_1$ and $CF_2$ to a voltage of zero. This will move the ferroelectric capacitor $CF_1$ from polarization state C to polarization state A while ferroelectric capacitor $CF_2$ will remain at polarization state D. As shown in FIG. 4A, the polarization state of ferroelectric capacitor $CF_1$ and $CF_2$ depends on the state of node 1 and node 2 at the beginning of the store sequence.

FIGS. 4B and 4C are graphs illustrating the hysteresis curve for ferroelectric capacitors $CF_1$ and $CF_2$ during different times of the store operation.

FIG. 5A is a timing diagram illustrating the restoring of the values of the logic element node values using the ferroelectric capacitor for the apparatus of FIG. 3. At time $T_0$, the states of $CF_1$ and $CF_2$ are the same as at the end of the store sequence, $CF_1$ is at polarization state A, $CF_2$ is at polarization state D. At time T1, the pre-charged circuitry is turned on at the same time the control line CL is turned on. This causes node 1 and node 2 to be pulled down to zero, which is an unstable state for the volatile logic element 22.

At time $T_1$, the pre-charge line (PCH) is pulled turned off right when the set line (SL) goes high. It is important that these two operations occur as close together as possible for reasons discussed below. When the pre-charge is turned off, the states of nodes 1 and node 2 will tend toward complementary states. Since the set line is set high at the same time, there will be five volts at the bottom of both ferroelectric capacitor $CF_1$ and $CF_2$ as well as zero volts at the top of ferroelectric capacitors $CF_1$ and $CF_2$. This means that ferroelectric capacitors $CF_1$ and $CF_2$ will move from their previous polarization states down to polarization state D. Since $CF_1$ is originally in state A, while the $CF_2$ is originally in polarization state B, the polarization of $CF_1$ will radically change while the polarization state of $CF_2$ will not change as much. This means that the more charge will be supplied from ferroelectric capacitor $CF_1$ than ferroelectric capacitor $CF_2$. This results in the voltage at node 1 to tip slightly high, whereas the voltage at node 2 will tend to be slightly lower. Since the transistors of inverters 22a and 22b are typically matched, as the voltage at node 1 rises slightly due to the charge from the ferroelectric capacitor $CF_1$, node 1 will be forced high and node 2 will be forced low.

This means that at time $T_3$ shortly after $T_2$, the set line is high and node 1 will be high, meaning that the polarization state of $CF_1$ will move to polarization state B. Since node 2 remains low, ferroelectric capacitor $CF_2$ remains in polarization state D.

At time $T_4$, the select line will go to zero. This will cause the ferroelectric capacitor $CF_1$ to move to state C since node 1 is high and SL is low. $CF_2$ will move to state B.

At time $T_5$, the control line CL goes low, meaning that node 1 and node 2 are isolated from ferroelectric capacitor CF1 and CF2. Also at time $T_5$ or a time slightly thereafter, the PCH line goes high meaning that the top layer of the ferroelectric capacitors CF1 and CF2 are pulled to ground, and the ferroelectric capacitor CF1 will move from polarization state C to polarization state A, while the ferroelectric capacitor $CF_2$ will remain in polarization state D.

Note that the information in the ferroelectric capacitor $CF_1$ and $CF_2$ is destroyed at time $T_2$, but since this causes node 1 and node 2 to go into the correct states, the states of node 1 and node 2 can be quickly re-stored into the ferroelectric capacitors $CF_1$ and $CF_2$.

During the re-store stage, the pass gate 22d isolates nodes 1 and 2 from logic element 20 and a comparable pass gate in the logic element 28 isolates node 1 and node 2 from that logic element. The pass gate 22c is typically open during the node re-store stage, meaning that nodes 1 and 2 can be tipped into their proper voltage states.

FIG. 6 illustrates an alternate embodiment of the present invention in which the apparatus 30 includes a controller circuit 32. Controller circuit 32 produces the signal for the control line, pre-charge line and set line. In a preferred embodiment, the same lines are used for connecting to each of the non-volatile circuitry 34 and 35. This means the data for each of the volatile logic elements can be stored at the same time in ferroelectric capacitors using the same control signals. The non-volatile circuitry 34 including ferroelectric capacitors can store the nodes at Q and $\overline{Q}$ of the volatile logic element 38 while the non-volatile circuitry 36 using ferroelectric capacitors store the states of nodes Q and $\overline{Q}$ of the volatile logic element 40. The circuitry 34 and 36 operates in the same manner as FIG. 4A–C and 5A–C discussed above. Looking again at FIG. 6, the advantage of using a single line for each of the control signals to the circuitry 34 and 36 is that address instructions need not be used. Additionally, the states of the different volatile logic elements can be stored at the same time. Thus, when power goes out, the state for the entire logic circuitry can be re-stored by using the ferroelectric capacitors. The address schemes used with memory arrays would be inappropriate for power loss protection since only one memory cell in an array column could be accessed at a given time.

The control circuitry 32 could also be such to supply the control signals CL, PCH, and SL before a planned power shutdown. This would mean that the signals shown in FIG.

4A would not have to occur within a normal clock pulse but could occur within a longer period of time.

The volatile logic elements used in the apparatus can be any of the types used in logic circuits. For example, the volatile logic elements may be latches or flip-flops. The volatile logic element 22 of FIG. 3 is a latch. The volatile logic elements 38 and 40 of FIG. 6 can be latches, flip-flops or any other type of volatile logic element which would lose data upon a power loss.

FIG. 7 is a diagram illustrating matched inverters inside a volatile logic element. Because such a pair of inverters is common in CMOS logic elements, the tipping described above for the re-storing steps can be done with most volatile logic elements.

FIG. 8 is a diagram showing a flip-flop 50 connected to non-volatile circuitry 52 of the present invention. This circuitry 52 operates in the same manner described with respect to FIGS. 3, 4A–C and 5A–C above. The flip-flop 50 of FIG. 8 could be a discrete component.

FIG. 9 illustrates an alternate embodiment of the present invention. In FIG. 9, circuitry 60 has a pre-charge circuit 62 attached directly to the node of the volatile logic element wherein the isolation transistors T1 and T2 are connected in between the pre-charged circuitry 52 and the dielectric capacitors $CF_1$ and $CF_2$. A disadvantage of this alternate embodiment is that care must taken that the nodes are not undesirably pulled to zero by the pre-charge circuitry. A possible advantage is that only a single isolation transistor T1 or T2 connects the nodes of the volatile logic element 64 with the ferroelectric capacitor $CF_1$ or $CF_2$.

Various details of the implementation and method are merely illustrative of the invention. It will be understood that various changes in such details may be within the scope of the invention, which is to be limited only by the appended claims.

What is claimed is:

1. An apparatus including:
   a logic circuit including a volatile logic element having a node defining a logic state at a first time, the node of logic element being connected to an input of another volatile logic element of the logic circuit; and
   circuitry operatively connected to the volatile logic element, the circuitry including a ferroelectric capacitor, the ferroelectric capacitor defining a voltage versus charge hysteresis curve, the circuitry adapted to set the position of the ferroelectric capacitor on the hysteresis curve depending on a value of the logic state at the node, wherein the value at the node is lost when the power to the apparatus is off and the circuitry is further adapted to restore the value of the logic state at the node of the volatile logic element using the ferroelectric capacitor when power is restored to the apparatus.

2. The apparatus of claim 1, wherein the volatile logic element is a latch.

3. The apparatus of claim 1, wherein the volatile logic element is a flip-flop.

4. The apparatus of claim 1, wherein the volatile logic element includes matched pair of inverters.

5. The apparatus of claim 1, wherein the logic circuit comprises a central processing unit.

6. The apparatus of claim 1, wherein an additional volatile logic element having nodes associated with an additional circuitry includes ferroelectric capacitors to store and restore the value of the node.

7. The apparatus of claim 6, wherein same control lines are sent to the circuitry and the additional circuitry.

8. The apparatus of claim 1, further comprising a controller for sending control signals to the circuitry.

9. The apparatus of claim 1, wherein the circuitry is operably connected to an additional node of the volatile logic element, the additional node normally having the obverse value from said node,
   the circuitry having an additional ferroelectric capacitor to store the value of the additional node.

10. The apparatus of claim 1, wherein the circuitry comprises a pre-charge circuit to pull the value at node toward ground.

11. The apparatus of claim 1, wherein the circuitry comprises an isolating transistor that allows the ferroelectric capacitor to be isolated from the node.

12. The apparatus of claim 11, wherein the circuitry comprises a pre-charge circuitry positioned with respect to the isolating transistor so that the voltage on one side of the ferroelectric capacitor can be pulled down while isolating transistor isolates the node of the volatile logic element.

13. An apparatus including:
   a logic circuit including a volatile logic element having a node defining a logic state at a first time, the node of logic element being connected to an input of another volatile logic element of the logic circuit; and
   circuitry operatively connected to the volatile logic element, the circuitry including a ferroelectric capacitor, the ferroelectric capacitor defining a voltage versus charge hysteresis curve, the circuitry including at least one isolating transistor that allows the ferroelectric capacitor to be selectively isolated from the node and a pre-charge circuit that can be used to pull down the voltage at the node, the circuitry adapted to set the position of the ferroelectric capacitor on the hysteresis curve depending on a value of the logic state at the node, wherein the value at the node is lost when the power to the apparatus is off and the circuitry is further adapted to restore the value of the logic state at the node of the volatile logic element using the ferroelectric capacitor when power is restored to the apparatus.

14. The apparatus of claim 13, wherein the isolating transistor is positioned with respect to the pre-charge circuit so that when the node of the volatile logic element is isolated from the ferroelectric capacitor, one side of the ferroelectric capacitor can set toward ground with the pre-charge circuit.

15. The apparatus of claim 1 wherein one end of the ferroelectric capacitor is connected to the isolating transistor.

16. A method comprising:
   operating a logic circuit including a volatile logic element, the volatile logic element having a node defining a logic state at a first time, the node of the logic element being connected to an input of another volatile logic element of the logic circuit;
   storing the value of the node using a ferroelectric capacitor; and
   after power to the volatile logic element is lost then restored, restoring a value at the node using the ferroelectric capacitor.

17. The method of claim 16, wherein the storing step includes using an isolating transistor to electrically connect and then isolate the node of the volatile logic element from the ferroelectric capacitor.

18. The method of claim 16, wherein one end of the ferroelectric capacitor is connected to a set line, wherein the storing step includes forcing the set line high, then low, while the node of the volatile logic element is electrically connected to the other end of the ferroelectric capacitor.

19. The method of claim 18, wherein the storing step includes setting the other end of the ferroelectric capacitor low.

20. The method of claim 19, wherein the storing step includes isolating the node of the volatile logic element from the other end of the ferroelectric capacitor, when the other end of the ferroelectric capacitor is set low.

21. The method of claim 16, wherein the restoring step comprises using more than one ferroelectric capacitors to store the value of multiple nodes.

22. The method of claim 16, wherein the restoring step comprises electrically connecting the other end of the ferroelectric capacitor to the node and pre-charging to set the nodes low.

23. The method of claim 16, wherein the restoring step comprises electrically connecting the other end of the ferroelectric capacitor to the node and pre-charging to set the nodes low.

24. The method of claim 23, wherein the restoring step further comprises stopping the pre-charge and forcing a set line attached to the ferroelectric capacitor high.

25. The method of claim 24, wherein the restoring step further comprises, thereafter, forcing the set line low.

26. The method of claim 25, wherein the restoring step further comprises electrically isolating the ferroelectric capacitor from the node and pre-charging the other end of the ferroelectric capacitor.

27. The method of claim 16, wherein the logic circuit is not part of a memory array and wherein the restoring step can be done without re-booting a central processing unit from the memory array.

28. The apparatus of claim 1, wherein the logic circuit is not part of a memory array and wherein the circuitry can restore the value of the node after a power failure without re-booting the central processing unit from a memory array.

29. The apparatus of claim 1, wherein the logic circuit is a central processing unit.

30. The apparatus of claim 1, wherein the logic circuit is an input/output circuit.

31. The apparatus of claim 13, wherein the logic circuit is not part of a memory array and wherein the circuitry can restore the value of the node after a power failure without re-booting the central processing unit from a memory array.

* * * * *